(12) United States Patent
Vu et al.

(10) Patent No.: US 7,453,389 B1
(45) Date of Patent: Nov. 18, 2008

(54) CORRELATED DOUBLE SAMPLING PING-PONG ARCHITECTURE WITH REDUCED DAC CAPACITORS

(75) Inventors: Ha Chu Vu, San Jose, CA (US); Seema Varma, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/846,470

(22) Filed: Aug. 28, 2007

(51) Int. Cl.
*H03M 1/12* (2006.01)

(52) U.S. Cl. .................... 341/172; 341/144; 348/241

(58) Field of Classification Search .......... 341/144–172
See application file for complete search history.

(56) References Cited

U.S. PATENT DOCUMENTS

| | | | | |
|---|---|---|---|---|
| 5,736,886 A | * | 4/1998 | Mangelsdorf et al. | 327/310 |
| 5,801,657 A | * | 9/1998 | Fowler et al. | 341/155 |
| 6,018,364 A | * | 1/2000 | Mangelsdorf | 348/241 |
| 6,342,919 B2 | * | 1/2002 | Opris | 348/241 |
| 6,587,143 B1 | | 7/2003 | Boisvert | 348/241 |
| 7,236,117 B1 | * | 6/2007 | Varma et al. | 341/155 |
| 7,274,009 B2 | * | 9/2007 | Huang et al. | 250/208.1 |
| 7,336,123 B2 | * | 2/2008 | Yoshida et al. | 330/9 |

OTHER PUBLICATIONS

LM98714 Three Channel, 16-Bit, 45 MSPS Digital Copier Analog Front End with Integrated CCD/CIS Sensor Timing Generator and LVDS Output, *National Semiconductor Corporation*, Oct. 2006, pp. 1-12.

* cited by examiner

*Primary Examiner*—Lam T Mai
(74) *Attorney, Agent, or Firm*—Merchant & Gould

(57) ABSTRACT

A method and apparatus can be arranged with a correlated double sampler circuit (CDS) for processing an output signal from an imaging device such as a charge-coupled device (CCD) image sensor. The CDS circuit includes an amplifier, a set of capacitors that are dynamically configured for sampling and holding operations, and a reduced number of capacitive digital-to-analog converter (CDAC) circuits, all arranged in a ping-pong architecture. The described ping-pong architecture is useful in digital imaging applications such as digital scanners, digital copiers, digital cameras, and digital camcorders, to name a few.

20 Claims, 9 Drawing Sheets

CORRELATED DOUBLE SAMPLING PING-PONG ARCHITECTURE WITH REDUCED DAC CAPACITORS

FIELD OF INVENTION

The present description relates to a method and apparatus for processing an output signal from an imaging device such as a charge-coupled device (CCD) image sensor. More particularly, a correlated double sampling (CDS) circuit is described that includes an amplifier and a reduced number of a capacitive digital-to-analog converter (CDAC) circuits that are dynamically configured using a ping-pong architecture.

BACKGROUND

CCD image sensors are widely used to convert images into electronic signals that can be captured, transmitted, stored and displayed. Digital imaging devices such as digital image scanners, digital video cameras and digital still cameras typically use CCDs.

A CCD divides an image into a large number of discrete cells or pixels that are often arranged as an array of rows or lines. During an exposure interval, each pixel in the array is arranged to convert incident light into electrons, which forms a current that is integrated by a capacitor. The current flow is proportional to the intensity of the exposure of the pixel based. At the end of the exposure interval, the accumulated charge for each pixel in the array corresponds to the scanned image. Prior to the next exposure interval, the pixels are reset to the "reset level" by initializing the capacitors to a specified voltage. The reset level and the charge accumulated for each pixel is transferred to an output port so that the resulting image can be processed.

An analog processing stage senses the output signal and removes the reset level from the image during a readout interval. The reset level varies over temperature due to thermal noise, and also varies from part to part due to processing variations. The reset level represents the voltage that is present when no light is incident on a pixel (i.e., the black level for the pixel). During the readout interval, the output signal includes the reset level followed by the signal level for the pixel. The difference between the signal level and the reset level indicates the amount of light (typically of a particular color) that has been impressed upon one particular pixel of the image sensor.

DETAILED DESCRIPTION

Figure 1A:
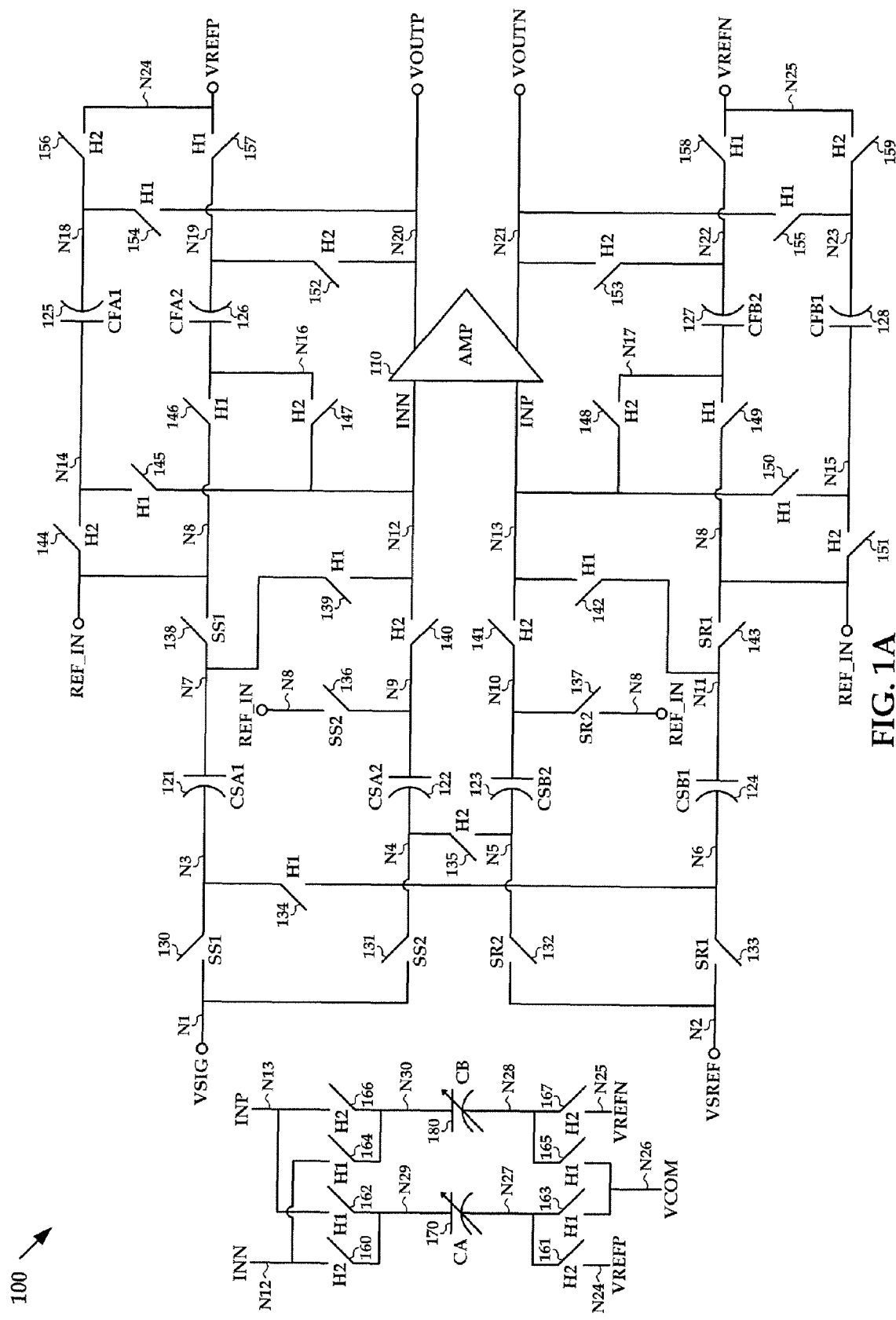
FIG. 1A is a schematic diagram that illustrates an example correlated double sampler circuit that employs a ping-pong architecture.

Various embodiments will be described in detail with reference to the drawings, where like reference numerals represent like parts and assemblies throughout the several views. References to various embodiments do not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for use of the terms. The meaning of "a," "an," and "the" may include reference to both the singular and the plural. The meaning of "in" may include "in" and "on." The term "connected" may mean a direct electrical, electromagnetic, mechanical, logical, or other connection between the items connected, without any electrical, mechanical, logical or other intermediary items. The term "coupled" can mean a direct connection between items, an indirect connection through one or more intermediaries, or communication between items in a manner that may not constitute a physical connection. The term "circuit" can mean a single component or a plurality of components, active and/ or passive, discrete or integrated, that are coupled together to provide a desired function. The term "signal" can mean at least one current, voltage, charge, data or other such identifiable quantity including electrically coupled and magnetically coupled signals.

Briefly stated, the present disclosure relates to a method and apparatus that can be arranged with a correlated double sampling (CDS) circuit for processing an output signal from an imaging device such as a charge-coupled device (CCD) image sensor. A correlated double sampling (CDS) circuit is described that includes an amplifier, a set of capacitors that are dynamically configured for sampling and holding operations, and a reduced number of capacitive digital-to-analog converter (CDAC) circuits, all arranged in a ping-pong architecture. The described ping-pong architecture is useful in digital imaging applications such as digital scanners, digital copiers, digital cameras, and digital camcorders, to name a few.

Correlated Double Sampling Ping-Pong Architecture

FIG. 1A is a schematic diagram that illustrates an example correlated double sampler (CDS) circuit that employs a ping-pong architecture in accordance with the present disclosure. CDS circuit 100 includes an amplifier circuit 110, capacitor circuits 121-128, switch circuits 130-167, and CDAC circuits 170 and 180.

Amplifier circuit 110 includes a first input terminal coupled to node N12, a second input terminal coupled to node N13, a first output terminal coupled to node N20, and a second output terminal coupled to node N21.

Capacitor circuit 121 is coupled between nodes N3 and N7, and has a value designated as CSA1. Capacitor circuit 122 is coupled between nodes N4 and N9, and has a value designated as CSA2. Capacitor circuit 123 is coupled between nodes N5 and N11, and has a value designated as CSB2. Capacitor circuit 124 is coupled between nodes N6 and N11, and has a value designated as CSB1. Capacitor circuit 125 is coupled between nodes N14 and N18, and has a value designated as CFA1. Capacitor circuit 126 is coupled between nodes N16 and N19, and has a value designated as CFA2. Capacitor circuit 127 is coupled between nodes N17 and N22, and has a value designated as CFB2. Capacitor circuit 128 is coupled between nodes N15 and N23, and has a value designated as CFB1.

CDAC circuit 170 is coupled between nodes N29 and N27, and has an effective capacitance value designated as CA. CDAC circuit 180 is coupled between nodes N30 and N28, and has an effective capacitance value designated as CB. Example capacitor circuit arrangements for CDAC circuits 170 and 180 are further discussed with reference to FIG. 1B.

Switch circuit 130 is coupled between nodes N1 and N3, and has a control terminal that is responsive to signal SS1. Switch circuit 131 is coupled between nodes N1 and N4, and has a control terminal that is responsive to signal SS2. Switch circuit 132 is coupled between nodes N2 and N5, and has a control terminal that is responsive to signal SR2. Switch circuit 133 is coupled between nodes N2 and N6, and has a control terminal that is responsive to signal SR1. Switch circuit 134 is coupled between nodes N3 and N6, and has a control terminal that is responsive to signal H1. Switch circuit 135 is coupled between nodes N4 and N5, and has a control terminal that is responsive to signal H2. Switch circuit 136 is coupled between nodes N8 and N9, and has a control terminal that is responsive to signal SS2. Switch circuit 137 is coupled between nodes N8 and N11, and has a control terminal that is responsive to signal SR2. Switch circuit 138 is coupled between nodes N7 and N8, and has a control terminal that is responsive to signal SS1. Switch circuit 139 is coupled between nodes N7 and N12, and has a control terminal that is responsive to signal H1. Switch circuit 140 is coupled between nodes N9 and N12, and has a control terminal that is responsive to signal H2. Switch circuit 141 is coupled between nodes N10 and N13, and has a control terminal that is responsive to signal H2. Switch circuit 142 is coupled between nodes N11 and N13, and has a control terminal that is responsive to signal H1. Switch circuit 143 is coupled between nodes N11 and N8, and has a control terminal that is responsive to signal SR1. Switch circuit 144 is coupled between nodes N8 and N14, and has a control terminal that is responsive to signal H2. Switch circuit 145 is coupled between nodes N14 and N12, and has a control terminal that is responsive to signal H1. Switch circuit 146 is coupled between nodes N8 and N16, and has a control terminal that is responsive to signal H1. Switch circuit 147 is coupled between nodes N12 and N16, and has a control terminal that is responsive to signal H2. Switch circuit 148 is coupled between nodes N13 and N17, and is responsive to signal H2. Switch circuit 149 is coupled between nodes N8 and N17, and is responsive to signal H1. Switch circuit 150 is coupled between nodes N13 and N15, and is responsive to signal H1. Switch circuit 151 is coupled between nodes N8 and N15, and is responsive to signal H2. Switch circuit 152 is coupled between nodes N19 and N20, and is responsive to signal H2. Switch circuit 153 is coupled between nodes N22 and N21, and is responsive to signal H2. Switch circuit 154 is coupled between nodes N18 and N20, and is responsive to signal H1. Switch circuit 155 is coupled between nodes N23 and N21, and is responsive to signal H1. Switch circuit 156 is coupled between nodes N18 and N24, and is responsive to signal H2. Switch circuit 157 is coupled between nodes N19 and N24, and is responsive to signal H1. Switch circuit 158 is coupled between nodes N22 and N25, and is responsive to signal H1. Switch circuit 159 is coupled between nodes N23 and N25, and is responsive to signal H2. Switch circuit 160 is coupled between nodes N29 and N12, and is responsive to signal H2. Switch circuit 161 is coupled between nodes N27 and N24, and is responsive to signal H2. Switch circuit 162 is coupled between nodes N29 and N13, and is responsive to signal H1. Switch circuit 163 is coupled between nodes N27 and N26, and is responsive to signal H1. Switch circuit 164 is coupled between nodes N30 and N12, and is responsive to signal H1. Switch circuit 165 is coupled between nodes N28 and N26, and is responsive to signal H1. Switch circuit 166 is coupled between nodes N30 and N13, and is responsive to signal H2. Switch circuit 167 is coupled between nodes N28 and N25, and is responsive to signal H2.

Control signal SS1 is asserted to selectively couple node N1 to node N3 via switching circuit 130. Control signal SS2 is asserted to selectively couple node N1 to node N4 via switching circuit 131. Control signal SR2 is asserted to selectively couple node N2 to node N5 via switching circuit 132. Control signal SR1 is asserted to selectively couple node N2 to node N6 via switching circuit 133. Control signal H1 is asserted to selectively couple node N3 to node N6 via switching circuit 134. Control signal H2 is asserted to selectively couple node N4 to node N5 via switching circuit 135. Control signal SS2 is also asserted to selectively couple node N8 to node N9 via switching circuit 136. Control signal SR2 is also asserted to selectively couple node N8 to node N10 via switching circuit 137. Control signal SS1 is also asserted to selectively couple node N7 to node N8 via switching circuit 138. Control signal H1 is also asserted to selectively couple node N7 to node N12 via switching circuit 139. Control signal H2 is also asserted to selectively couple node N9 to node N12 via switching circuit 140. Control signal H2 is also asserted to selectively couple node N10 to node N13 via switching circuit 141. Control signal H1 is also asserted to selectively couple node N11 to node N13 via switching circuit 142. Control signal SR1 is also asserted to selectively couple node N11 to node N8 via switching circuit 143. Control signal H2 is also asserted to selectively couple node N8 to node N14 via switching circuit 144. Control signal H1 is also asserted to selectively couple node N12 to node N14 via switching circuit 145. Control signal H1 is also asserted to selectively couple node N8 to node N16 via switching circuit 146. Control signal H2 is also asserted to selectively couple node N12 to node N16 via switching circuit 147. Control signal H2 is also asserted to selectively couple node N13 to node N17 via switching circuit 148. Control signal H1 is also asserted to selectively couple node N8 to node N17 via switching circuit 149. Control signal H1 is also asserted to selectively couple node N13 to node N15 via switching circuit 150. Control signal H2 is also asserted to selectively couple node N8 to node N15 via switching circuit 151. Control signal H2 is also asserted to selectively couple node N19 to node N20 via switching circuit 152. Control signal H2 is also asserted to selectively couple node N22 to node N21 via switching circuit 153. Control signal H1 is also asserted to selectively couple node N18 to node N20 via switching circuit 154. Control signal H1 is also asserted to selectively couple node N23 to node N21 via switching circuit 155. Control signal H2 is also asserted to selectively couple node N18 to node N24 via switching circuit 156. Control signal H1 is also asserted to selectively couple node N19 to node N24 via switching circuit 157. Control signal H1 is also asserted to selectively couple node N22 to node N25 via switching circuit 158. Control signal H2 is also asserted to selectively couple node N23 to node N25 via switching circuit 159. Control signal H2 is also asserted to selectively couple node N29 to node N12 via switching circuit 160. Control signal H2 is also asserted to selectively couple node N27 to node N24 via switching circuit 161. Control signal H1 is also asserted to selectively couple node N29 to node N13 via switching circuit 162. Control signal H1 is also asserted to selectively couple node N27 to node N26 via switching circuit 163. Control signal H1 is also asserted to selectively couple node N30 to node N12 via switching circuit 164. Control signal H1 is also asserted to selectively couple node N28 to node N26 via switching circuit 165. Control signal H2 is also asserted to selectively couple node N30 to node N13 via switching circuit 166. Control signal H2 is also asserted to selectively couple node N28 to node N25 via switching circuit 167.

The amplifier circuit 10 is arranged to sense a signal that is applied across the input terminals at nodes N12 and N13, and provide amplification in response thereto that is differentially observed across the output terminals at nodes N20 and N21. Signals INN and INP correspond to the signals applied across to nodes N12 and N13, respectively. Signals VOUTP and VOUTN correspond to the signals at nodes N20 and N21, respectively. Amplifier circuit 10 can be any reasonable implementation including a fully-differential operational amplifier circuit.

An input signal VSIG is coupled to node N1, while a reference signal VSREF is coupled node N2. In some example implementations, the input signal (VSIG) and the reference signal (VREF) is provided at the same terminal, and nodes N1 and N2 are effectively shorted together. In some other example implementations, the input signal (VSIG) and the reference signal (VREF) are provided by different terminals, such as is illustrated by nodes N1 and N2 in FIG. 1A.

Signal REF_IN is applied to node N8, and can be any appropriate voltage that serves as a common-mode voltage (VCM) that is desired for the amplifier circuit 110. For simplicity, the remaining disclosure refers to the voltage at node N8 as a signal ground.

Signal VREFP is applied to node N24, while signal VREFN is applied to node N25. The voltages associated with VREFP and VREFN are used to initialize the feedback capacitor circuits (i.e., 125-128), and the CDAC circuits (i.e., 170 and 180) for amplifier circuit 110 during one or more operating phases of the CDS circuit (100).

Signal VCOM is applied to node N26. The voltages associated with VCOM is used to initialize the capacitor circuits (e.g., see FIG. 1B) that are in the CDAC circuits during one or more operating phases of the CDS circuit (100). In some examples, VCOM is not an applied voltage and instead the voltage associated with node N26 floats to a point between VREFP and VREFN when switching circuits 163 and 165 are closed in response to control signal H1.

Figure 1B:
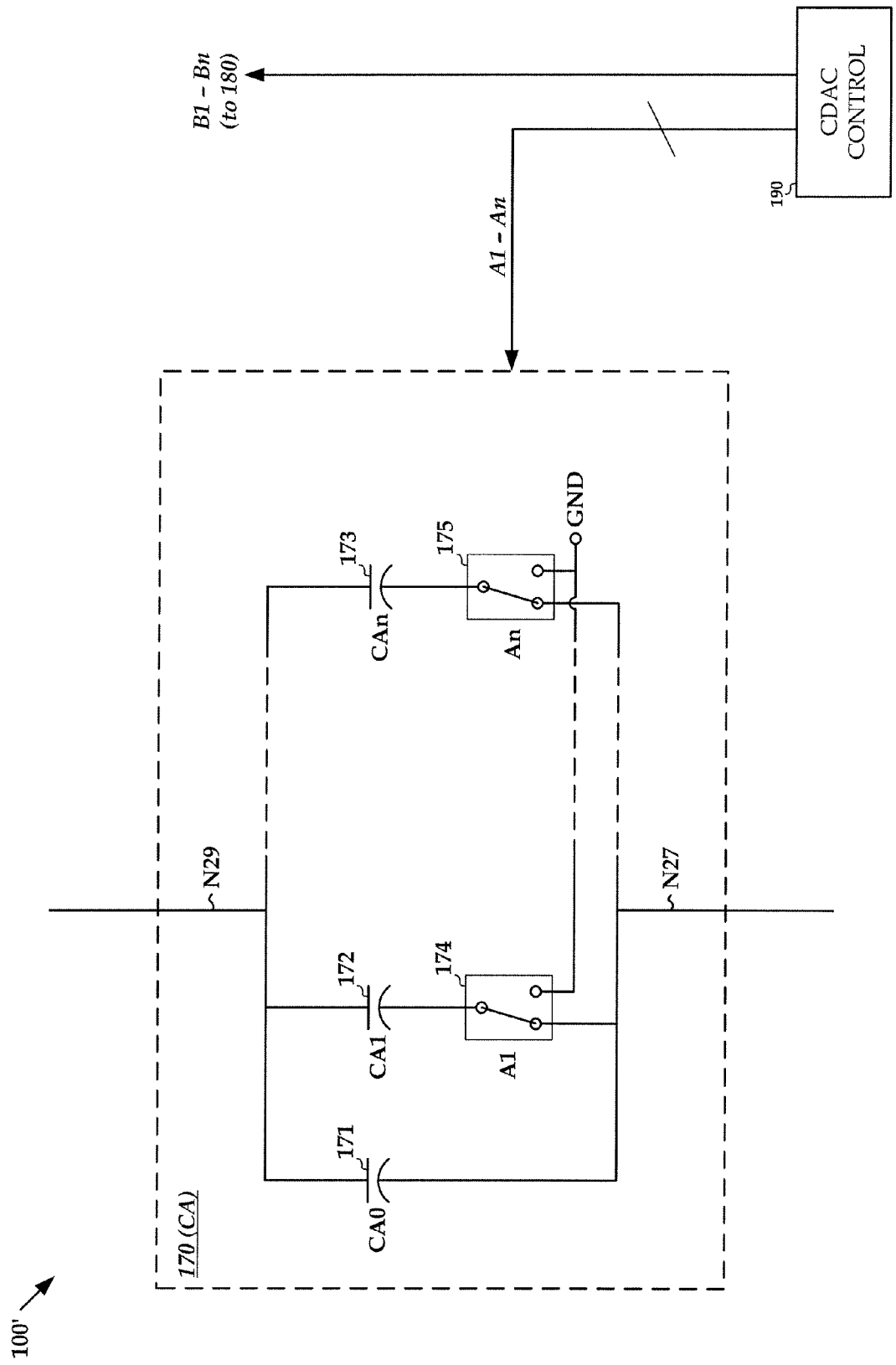
FIG. 1B is a schematic diagram that illustrates an example capacitive digital-to-analog converter and related control circuitry.

FIG. 1B is a schematic diagram that illustrates an example capacitive digital-to-analog converter (CDAC) circuit (170) and related control circuitry (e.g., CDAC CONTROL 190), such as might be used by a CDS circuit (100') such as CDS circuit 100 of FIG. 1A.

The CDAC circuit (170) includes an array of capacitor circuits (e.g., 171-173), and a set of switching circuits (174-175). Capacitor circuit 171 is coupled between nodes N29 and N27, and has an effective capacitance value of CA0. Capacitor circuit 172 is selectively coupled between nodes N29 and N27 when switch circuit 174 is operated in response to control signal A1, and has an effective capacitance value of CA1. Switch circuit 174 is also arranged to selectively couple capacitor circuit 172 between node N27 and a signal ground (GND) in response to an inverse of control signal A. Additional capacitance values (e.g., CAn) can further be selectively coupled either between nodes N29 and N27 or between nodes N29 and the signal ground (GND) via additional switching circuits (e.g., 175) in response to other control signals (e.g., An).

The array of capacitor circuits (e.g., 171-173) is arranged to provide a programmable effective capacitance value that is designated as CA, which is programmed in response to a set of control signals (e.g., A1-An) from CDAC CONTROL circuit 190. Another array of capacitor circuits (not shown) and related switching circuits (not shown) can similarly be arranged to provide a programmable effective capacitance value of CB for CDAC circuit 180, which is programmed in response to a second set of control signals (e.g., B1-Bn) from CDAC CONTROL circuit 190.

The various capacitor circuits (e.g., 121-128, and 171-173) can be implemented as any appropriate circuit arrangement that provides a desired capacitance value. Example capacitor circuits include discrete and integrated capacitors, including but not limited to metal plate capacitors, polysilicon based capacitors, and transistors that are arranged to operated as capacitors (e.g., gate-drain capacitance). Multiple capacitors can be combined together in a series arrangement, a parallel arrangement, or a combination of series and parallel capacitors to obtain the desired values. In one example, each capacitor circuit includes a plurality of unit sized capacitors that are arranged together to provide improved matching of effective capacitance between different capacitor circuits.

The switch circuits (e.g., 130-167 and 174-175) can be any appropriate switching circuit arrangement including bipolar junction transistor (BJT) circuits and field effect transistor (FET) circuits including junction field effect transistor (JFET) circuits, and metal oxide semiconductor (MOS) circuits. Example switching circuit arrangements can include single transistors (either p-type or n-type) and complementary transistor pair arrangement such as transmission gates, to name a few.

Example Signals Waveforms

FIGS. 2A-2G are timing diagrams that illustrate signal waveforms for a CDS circuit such as is illustrated by FIG. 1A and/or FIG. 1B.

Figure 2A:
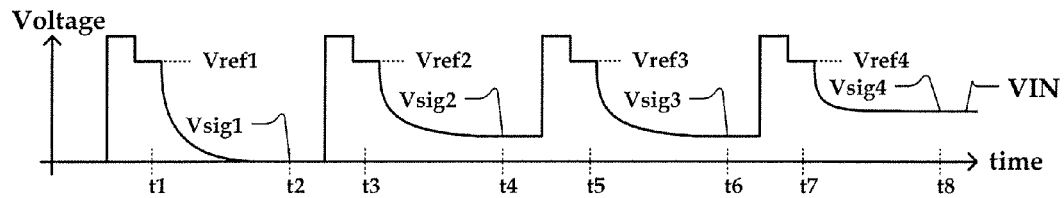
FIGS. 2A-2G are timing diagrams that illustrate signal waveforms for a correlated double sampler circuit.

FIG. 2A illustrates an example signal waveform for a CCD image sensor that can serve as an input (VIN) for the CDS circuit. The high voltage level that precedes the low level portion of each cycle is commonly called the "reset level" or "reference level", while the lower voltage level is commonly called the "signal level." At times t1, t3, t5, and t7, the input (VIN) corresponds to a reference signal (VSREF) that has a value corresponding to a respective one reset levels Vref1, Vref2, Vref3 and Vref4. Although FIG. 2A illustrates that the values for the reset levels are substantially the same, the reset levels can change as a result of thermal noise and other non-ideal effects so that the values are not consistently the same. At times t2, t4, t6, and t8, the input (VIN) corresponds to an input signal (VSIG) that has a value corresponding to a respective one of signal levels Vsig1, Vsig2, Vsig3 and Vsig4. The values for the signal levels vary based on exposure time and other factors related to each individual pixel in the CCD array. The difference between a signal level and its preceding reset level indicates the amount of light (typically of a particular color) that has fallen on one particular pixel of the image sensor.

Figure 2B:
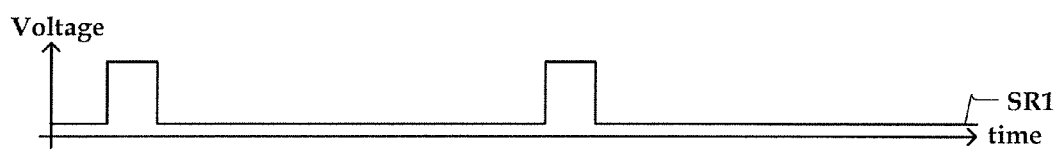
Figure 2C:
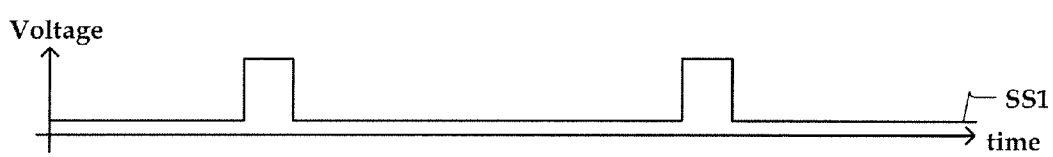
Figure 2D:
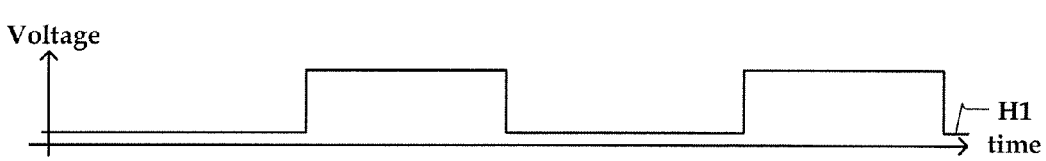
Figure 2E:
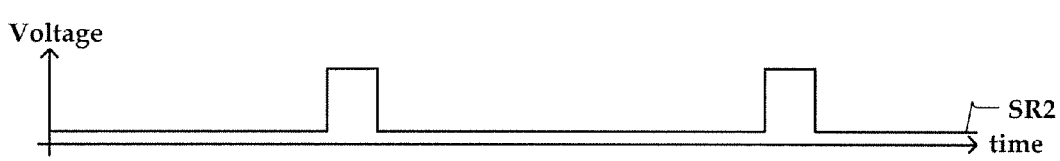
Figure 2F:
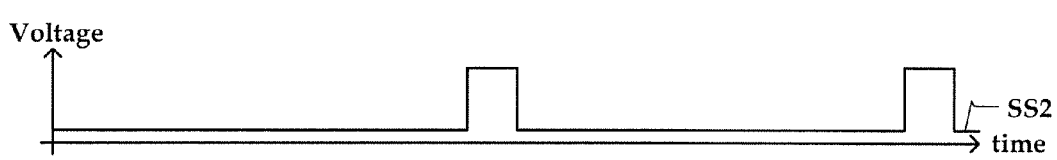
Figure 2G:
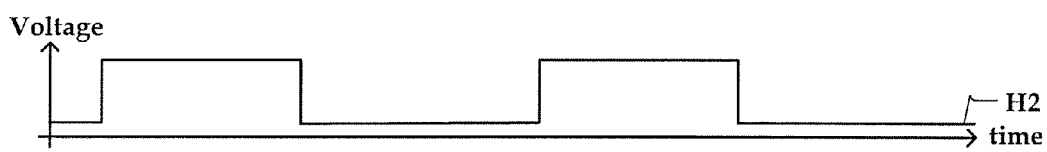

FIG. 2B illustrates an example signal waveform for a first control signal SR1, which is asserted during the sampling phase of CDS circuit 100 and/or 100' so that the reference level (e.g., for VSREF) is sampled at the appropriate time for the "ping" phase. FIG. 2C illustrates an example signal waveform for a second control signal SS1, which is asserted during the sampling phase of CDS circuit 100 and/or 100' so that the signal level (e.g., for VSIG) is sampled at the appropriate time for the "ping" phase. FIG. 2D illustrates an example signal waveform for a third control signal H1, which is asserted during the hold phase of CDS circuit 100 and/or 100' so that the prior sampled signals for the "ping" phase are held at the appropriate time during the sampling period for the "pong" phase. FIG. 2E illustrates an example signal waveform for a fourth control signal SR2, which is asserted during the sampling phase of CDS circuit 100 and/or 100' so that the reference level (e.g., for VSREF) is sampled at the appropriate time for the "pong" phase. FIG. 2F illustrates an example signal waveform for a fifth control signal SS2, which is asserted during the sampling phase of CDS circuit 100 and/or 100' so that the signal level (e.g., for VSIG) is sampled at the appropriate time for the "pong" phase. FIG. 2G illustrates an example signal waveform for a sixth control signal H2, which is asserted during the hold phase of CDS circuit 100 and/or 100' so that the prior sampled signals for the "pong" phase are held at the appropriate time during the sampling period for the "ping" phase.

Equivalent Circuits

FIGS. 3A-3D are schematic diagrams that illustrate equivalent circuits for the correlated double sampler circuit of FIG. 1A and/or FIG. 1B during operation with the signal waveforms of FIGS. 2A-2G.

Figure 3A:
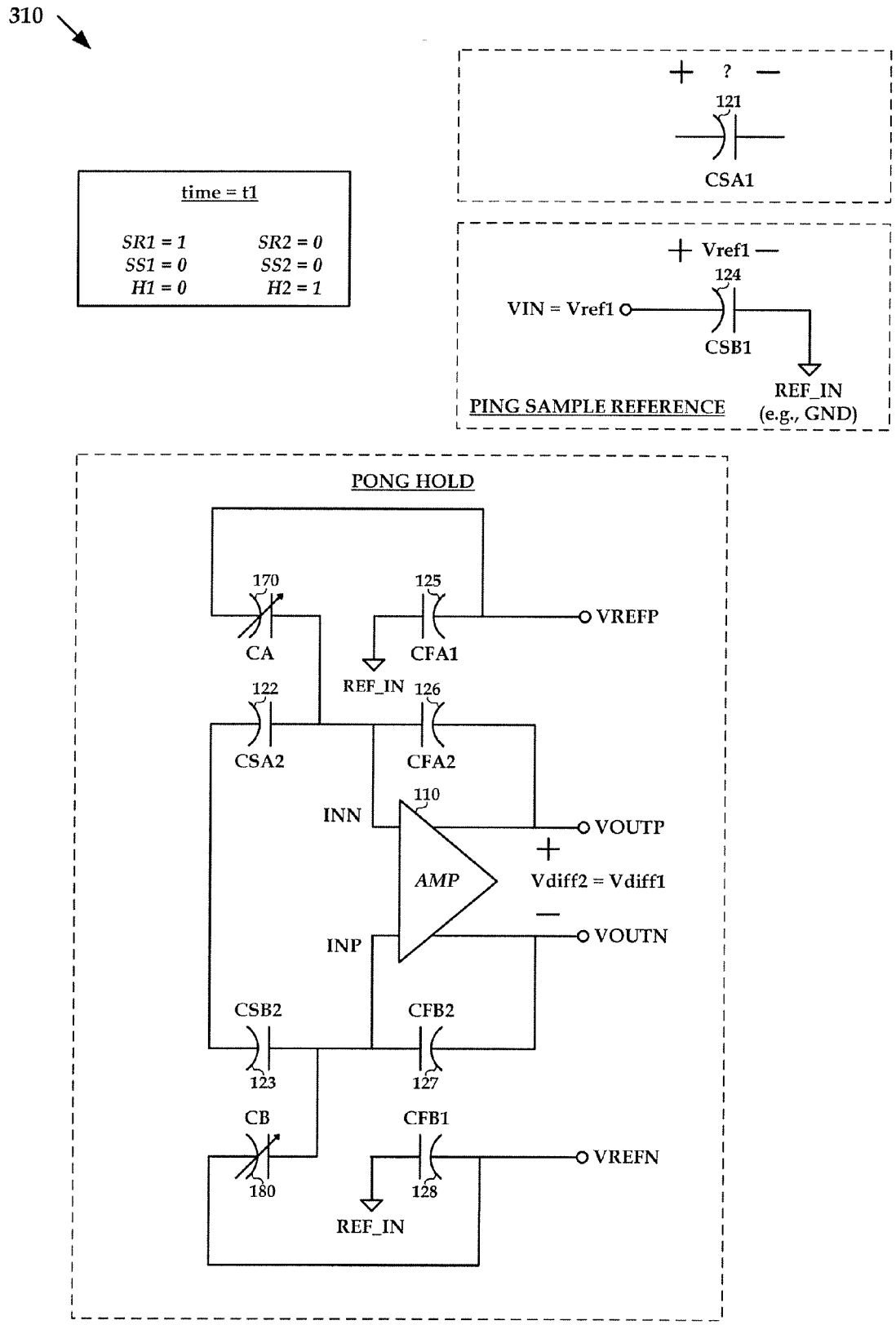
FIGS. 3A-3D are schematic diagrams that illustrate equivalent circuits for the correlated double sampler circuit of FIG. 1A and/or FIG. 1B during operation with the signal waveforms of FIGS. 2A-2G.

FIG. 3A illustrates a first equivalent circuit (310) for CDS circuit 100 and/or 100' at time t1, where the control signals have logical values that correspond to: SR1=1, SR2=0, SS1=0, SS2=0, H1=0, and H2=1. At time t1, amplifier circuit 110 is arranged in a hold configuration with CDAC circuit 170, CDAC circuit 180, and capacitor circuits 122, 123, 126 and 127. Also at time t1, capacitor circuit 124 is arranged in a sampling configuration to sample a reference level for a "ping" pixel, which can be referred to as a "ping sample reference" configuration. The hold configuration at time t1 corresponds to a hold configuration for a previously sampled "pong" pixel, which can be referred to as a "pong hold" configuration. The output signal (Vdiff1) is observed as the difference between VOUTP and VOUTN and is determined by the sampled reset level (Vref) and the sampled signal level (Vsig) of a prior sampling cycle (signal levels for a prior "pong" pixel), as well as the various reference levels (VREFP and VREFN), the relative capacitance values for capacitor circuits 122, 123, 126 and 127, and the effective capacitance values for CDAC circuits 170 and 180. The input signal (VIN) at time t1 corresponds to a reference level for a "ping" pixel (e.g., VSREF=VIN=Vref1), which is effectively stored by capacitor circuit 124. Also at time t1, capacitor circuits 125 and 128 are initialized or pre-charged in an "initialization configuration" by coupling the terminals of each capacitor circuit (125 and 128) between an input common mode voltage (e.g., REF_IN) and a respective one of the reference voltages (VREFP or VREFN). Further at time t1, CDAC circuits 170 and 180 are coupled between a corresponding one of the reference voltages (VREFP and VREFN) and a corresponding one of the input nodes (e.g., INN and INP) for amplifier circuit 110.

Figure 3B:
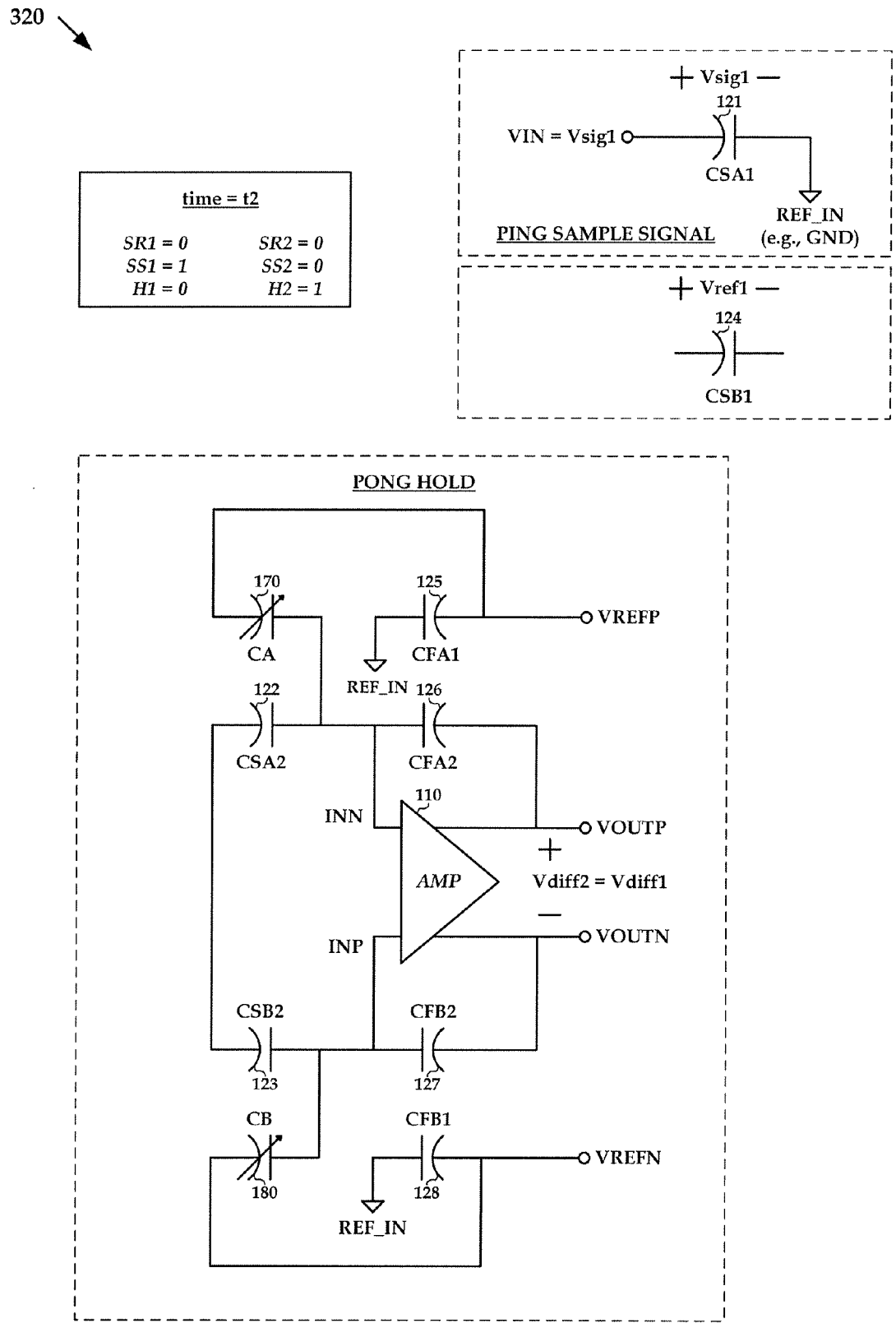

FIG. 3B illustrates a second equivalent circuit (320) for CDS circuit 100 and/or 100' at time t2, where the control signals have logical values that correspond to: SR1=0, SR2=0, CS1=1, SS2=0, H1=0 and H2=1. At time t2, the amplifier circuit 110 is maintained in the same "pong hold" configuration as illustrated by FIG. 3A, and the output signal (Vdiff2) remains unchanged from the prior equivalent circuit (e.g., Vdiff2=Vdiff1). Also at time t2, capacitor circuit 121 is arranged in a sampling configuration to sample a signal level for a "ping" pixel, which can be referred to as a "ping sample signal" configuration. Capacitor circuit 124 is decoupled from sampling the input signal for the reference level (e.g., Vref1) at time t2. Although capacitor circuit 124 is illustrated as floating, the charge from the previous sampled voltage from time t1 (i.e., Vref1) is stored by capacitor circuit 124 such that the resulting voltage is unchanged. The input signal (VIN) at time t2 corresponds to a signal level for the "ping pixel" (e.g., VSIG=VIN=Vsig1), which is effectively stored by capacitor circuit 121. Also at time t2, capacitor circuits 125 and 128 are maintained in their initialization configuration, where their terminals are coupled between the input common mode voltage (e.g., REF_IN) and a respective one of the reference voltages (e.g., VREFP or VREFN). Further at time t2, CDAC circuits 170 and 180 are maintained as coupled between their corresponding reference voltage (VREFP or VREFN) and their corresponding input node (INN or INP) for amplifier circuit 110.

Figure 3C:
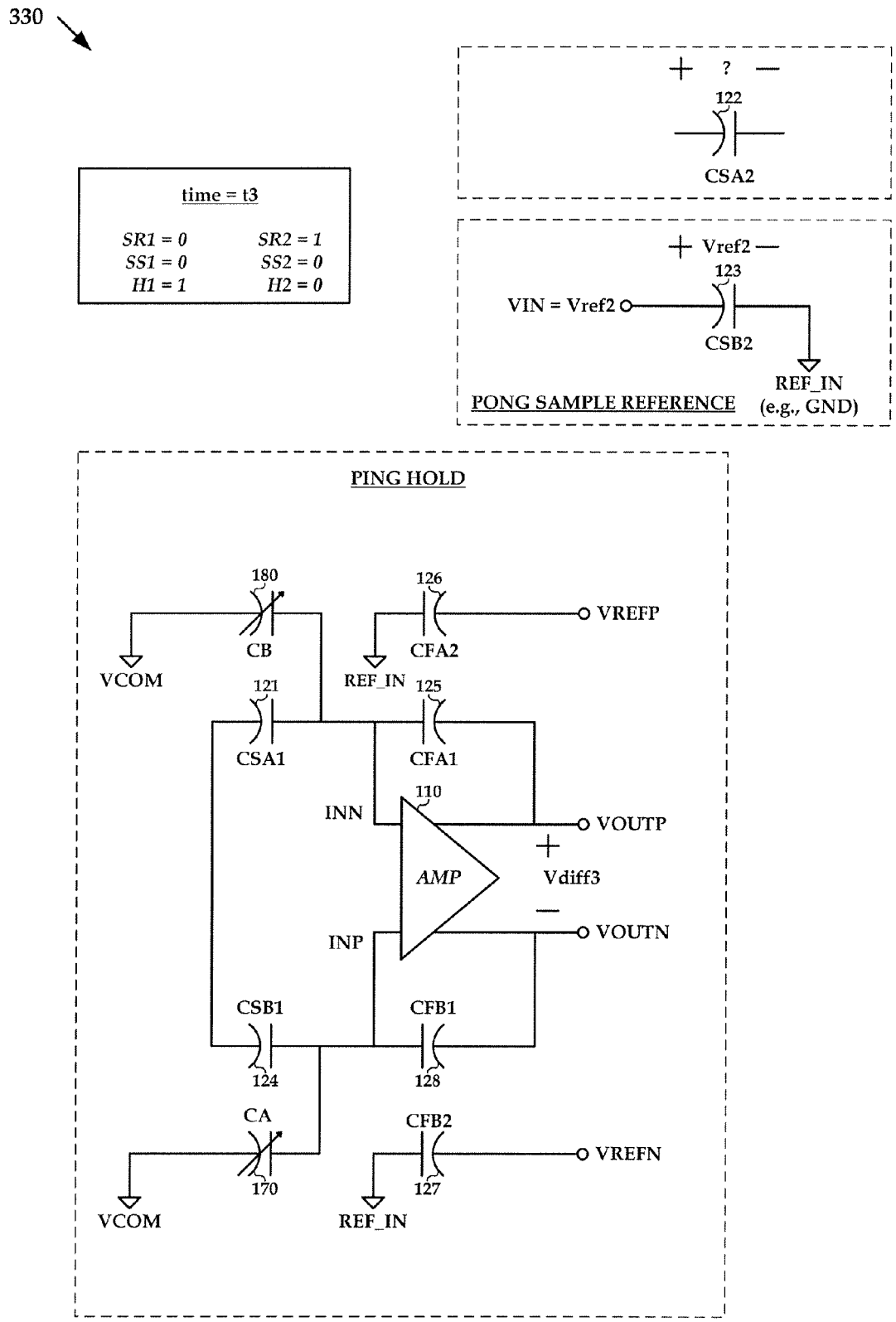

FIG. 3C illustrates a third equivalent circuit (330) for CDS circuit 100 and/or 100' at time t3, where the control signals have logical values that correspond to: SR1=0, SR2=1, SS1=0, SS2=0, H1=1, and H2=9. At time t3, amplifier circuit 110 is arranged in a hold configuration with CDAC circuit 170, CDAC circuit 180, and capacitor circuits 121, 124, 125 and 128. Also at time t3, capacitor circuit 123 is arranged in a sampling configuration to sample a reference level for a "pong" pixel, which can be referred to as a "pong sample reference" configuration. The hold configuration at time t3 corresponds to a hold configuration for a previously sampled "ping" pixel, which can be referred to as a "ping hold" configuration. The output signal (Vdiff3) is observed as the difference between VOUTP and VOUTN is determined by the sampled reset level (Vref1) and the sampled signal level (Vsig1) from the prior sampling cycle (i.e., signals from the prior "ping" pixel) at times t1 and t2, as well as the various reference levels (VREFP and VREFN), the relative capacitance values for capacitor circuits 121, 124, 125 and 128, and the effective capacitance values for CDAC circuits 170 and 180. The input signal (VIN) at time t3 corresponds to a reference level for a "pong pixel" (e.g., VSREF=VI=Vref2), which is effectively stored by capacitor circuit 123. Also at time t3, capacitor circuits 126 and 127 are initialized or "pre-charged" in another "initialization configuration" by coupling the terminals of each capacitor circuit (126 and 127) between the input common mode voltage (e.g., REF_IN) and the respective one of the reference voltages (VREFP or VREFN). Further at time t3, CDAC circuits 170 and 180 are coupled between an output common mode voltage (VCOM) and a corresponding one of the input nodes (INN or INP) for amplifier circuit 110.

Figure 3D:
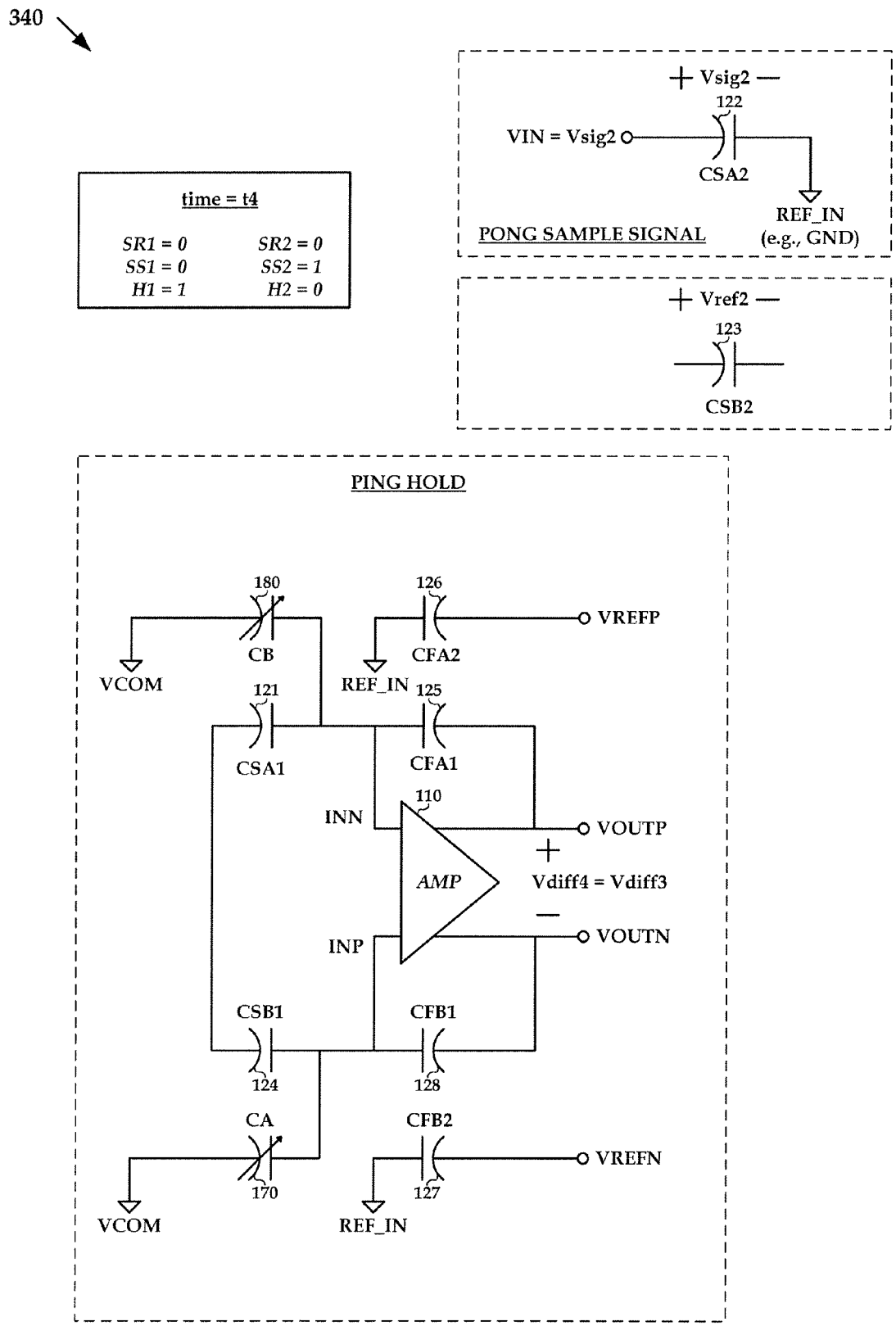

FIG. 3D illustrates a fourth equivalent circuit (320) for CDS circuit 100 and/or 100' at time t4, where the control signals have logical values that correspond to: SR1=0, SR2=0, SS1=0, SS2=1, H1=1 and H2=0. At time t4, the amplifier circuit 110 is maintained in the same "ping hold" configuration as illustrated by FIG. 3C, and the output signal (Vdiff4) remains unchanged from the prior equivalent circuit (e.g., Vdiff4=Vdiff3). Also at time t4, capacitor circuit 122 is arranged in a sampling configuration to sample a signal level for the "pong" pixel, which can be referred to as a "pong sample signal" configuration. Capacitor circuit 123 is decoupled from sampling the input signal for the reference level (e.g., Vref2) at time t4. Although capacitor circuit 123 is illustrated as floating, the charge from the previous sampled voltage from time t3 (i.e., Vref2) is stored by capacitor circuit 123 such that the resulting voltage is unchanged. The input signal (VIN) at time t4 is given as VSIG=VIN=Vsig2, and the voltage associated with input signal VIN (a signal level for the "pong" pixel) is stored by capacitor circuit 122. Also at time t4, capacitor circuits 126 and 127 are maintained in their initialization configuration, where their terminals are coupled between the input common mode voltage (e.g., REF_IN) and a respective one of the reference voltages (VREFP or VREFN). Further at time t4, CDAC circuits 170 and 180 are maintained as coupled between the output common mode voltage (VCOM) and their corresponding input node (INN or INP) for amplifier circuit 110.

At times t5 and t6, another ping pixel is sampled as signal levels Vref3 and Vsig3, which are sampled in substantially the same manner as described previously with respect to FIGS. 3A and 3B. A pong hold configuration is also utilized at times t5 and t6 in substantially the same manner as described previously with respect to FIG. 3A and FIG. 3B, where the prior "pong" pixel samples correspond to the sampled signal levels Vref2 and Vsig2. At times t7 and t8, another pong pixel is sampled as signal levels Vref4 and Vsig4, which are sampled in substantially the same manner as described previously with respect to FIGS. 3C and 3D. A ping hold configuration is also utilized at times t7 and t8 in substantially the same manner as described previously with respect to FIG. 3C and FIG. 3D, where the prior "ping" pixel samples correspond to the sampled signal levels Vref3 and Vsig3. The pattern for ping and pong sample and hold configuration repeats in a similar manner as described above.

As can be seen by the illustrated example waveforms and equivalent circuits of FIGS. 2A-2G and 3A-3D, the operation of CDS circuit 100 and/or 100' utilizes a ping-pong architecture where sets of the sampling and feedback capacitor circuits are alternately selected for each cycle. The alternating cycles can be described as alternating between ping hold cycles and pong hold cycles. Within each hold cycle, there is a reference sampling interval and a signal sampling interval. During the reference and signal sampling intervals for a ping pixel, the pong pixel is in a hold cycle. Similarly, during the reference and signal sampling intervals for a pong pixel, the ping pixel is in a hold cycle. The process continues and the output of amplifier circuit 110 corresponds to a pipeline of pixel values alternating between ping and pong pixels.

There may be no prior pixel samples for the sampling capacitors (121-124) and the feedback capacitors (125-128) prior to time t1. In this instance, the voltage across capacitor circuit 121 is an unknown quantity, which is illustrated as by the question mark for the voltage across capacitor circuit 121 in FIG. 3A. Similarly, the output signal (Vdiff1) of amplifier 110 at time t1 should be ignored since the prior initial condition of sampling capacitor circuits 122-123 and feedback capacitor circuits 126-127 are unknown.

Example CDS System Configuration

Figure 4:
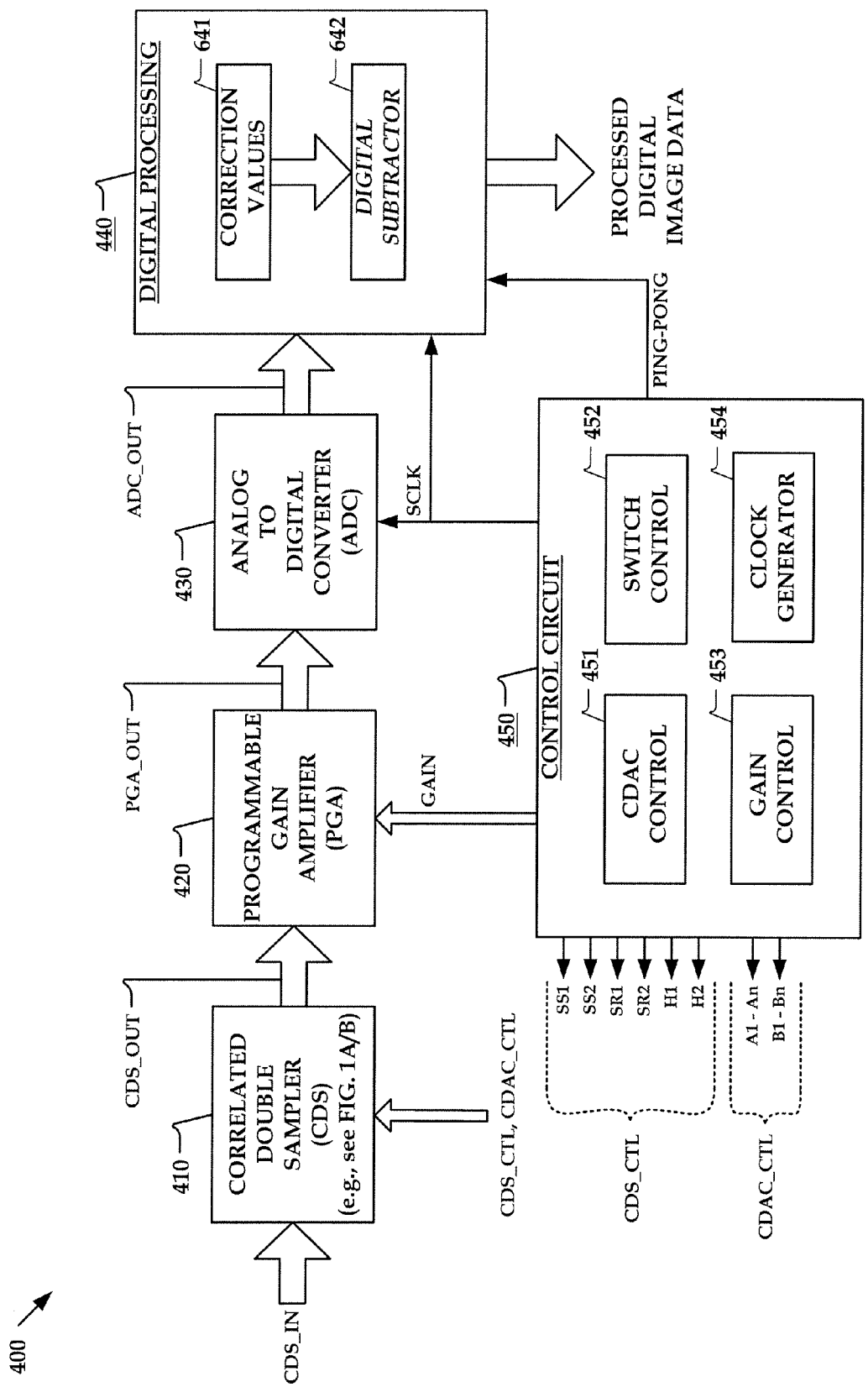
FIG. 4 is a schematic diagram that illustrates an image scanning system that is arranged for operation with the correlated double sampler circuit of FIG. 1A; all configured in accordance with some embodiments of the present disclosure.

FIG. 4 is a schematic diagram of an image scanning system 400 that is arranged for operation with the correlated double sampler circuit of FIGS. 1A and/or 1B, arranged in accordance with some embodiments of the present disclosure. Image scanning system 400 includes a correlated double sampler (CDS) circuit 410 arranged as described previously with reference to FIGS. 1A and/or 1B, a programmable gain amplifier (PGA) circuit 420, an analog-to-digital converter (ADC) circuit 430, a digital processing circuit 440, and a control circuit 450.

CDS circuit 410 includes a signal input terminal for receiving an input signal (VIN), a control input for receiving one or more control signals (CDS_CTL, CDAC_CTL), and a signal output terminal that is arrange to provide an output signal (CDS_OUT). PGA circuit 420 includes a signal input terminal for receiving signal CDS_OUT, a control input terminal for receiving one or more gain control signals (GAIN), and a signal output terminal that is arranged to provide an output signal (PGA_OUT). ADC circuit 430 includes a signal input terminal for receiving signal PGA_OUT, a clock input terminal for receiving a system clock signal (SCLK), and an output terminal that is arranged to provide a digital output signal (ADC_OUT). Digital processing circuit 440 includes a signal input terminal for receiving signal ADC_OUT, a clock input terminal for receiving the system clock signal (SCLK), a control input signal for receiving one or more control signals (PING-PONG), and a signal output terminal that is arranged to provide a processed digital image data.

Control circuit 450 includes a first function block for CDAC control 451, a second functional block for a switch control 452, a third functional block for a gain control 453, and a fourth functional block for a clock generator 454. Although illustrated as separate functional blocks, the overall functionality of control circuit 450 can be separated into additional function blocks, or combined and integrated into fewer functional blocks as may be desired. In some examples, all of the functional blocks are combined together into a single circuit implementation.

The CDAC control functional block 451 is arranged to control the operation of the CDAC circuits (e.g., 170 and 180) for adjusting the offset of signal CDS_OUT for each pixel via CDAC control signals (CDAC_CTL). The switch control functional block 452 is arranged to control the operation of the switch circuits in CDS circuit 410 based on the system clock via CDS control signals (CDS_CTL). The gain control functional block 453 is arranged to adjust the gain control signals (GAIN) that are used by PGA circuit 420. The clock generator functional block 454 is arranged to generate the system clock signal (SCLK), which is used by other functional blocks and circuits. Example CDS control signals (CDS_CTL) for CDS circuit 410 can includes any number of necessary signal such as for example signal SS1, SS2, SR1, SR2, H1 and H2 as illustrated in FIG. 1A, FIGS. 2A-2G, and FIGS. 3A-3D. Example CDAC control signals (CDAC_CTL) for CDS circuit 410 can include any number of necessary signal to operate the CDAC circuits (e.g., 170 and 180) within the CDS circuit 410 such as for example signals A1-An and B1-Bn, as illustrated and described with reference to FIG. 1B. Also, signal PING-PONG is generated by control circuit 450 to indicate the status of the operation of CDS circuit 410 during operation so that the signal CDS_OUT is known by digital processing circuit 440 as either associated with the "ping" cycle or the "pong" cycle.

Digital processing circuit 440 is arranged to apply correction values 441 to a digital subtractor 442 so that offsets associated with each pixel are digitally removed from the digital image data. For example, amplifier circuit 110 in CDS circuit 100 of FIG. 1 may have an input referred offset that is present in signal CDS_OUT. Since CDS_OUT utilizes a ping-pong architecture as previously described, alternating cycles of "ping" and "pong" may have a different input referred offset. The input referred offset determined during a calibration mode where the input signal VIN is coupled to a signal ground for both alternating cycles of "ping" and "pong." After the input referred offset is determined, the image scanning process can be commenced and the input referred offset can be digitally subtracted from the ADC_OUT signal for each pixel based on the cycle status as ping or pong.

Although digital processing circuit 440 is described-above with reference to input-referred offsets in amplifier circuit 110, the present disclosure is not so limited. Identical pixels that are processed by the "ping" and "pong" paths in CDS circuit 410 may not be identical due to mismatches resulting from various non-ideal factors (e.g., thermal effects, processing gradients, etc.). Further errors from mismatches can result from increased gain in the CDS circuit 410 and PGA circuit 420. Moreover, additional errors may be introduced by ADC circuit 430. The observed errors can thus include numerous factors from errors introduced in the overall signal path resulting in systematic errors. The effects of mismatches from the "ping" and "pong" signal paths can be is calibrated out using digital correction in the digital post-processing section as described. Correction values for each signal path can be statically determined during a calibration cycle, or dynamically calculated such as during the black loop cycle in the imaging system. Half of the correction can be applied to the pixel data from the "ping" cycle, while the other half of the correction can be applied to the pixel data from the "pong" cycle. The various correction values for the digital processing circuit 440 can be store in a look-up table, a register, or any other means for storing correction values as may be desired.

Comparison of Performance with Conventional CDS Circuits

Figure 5:
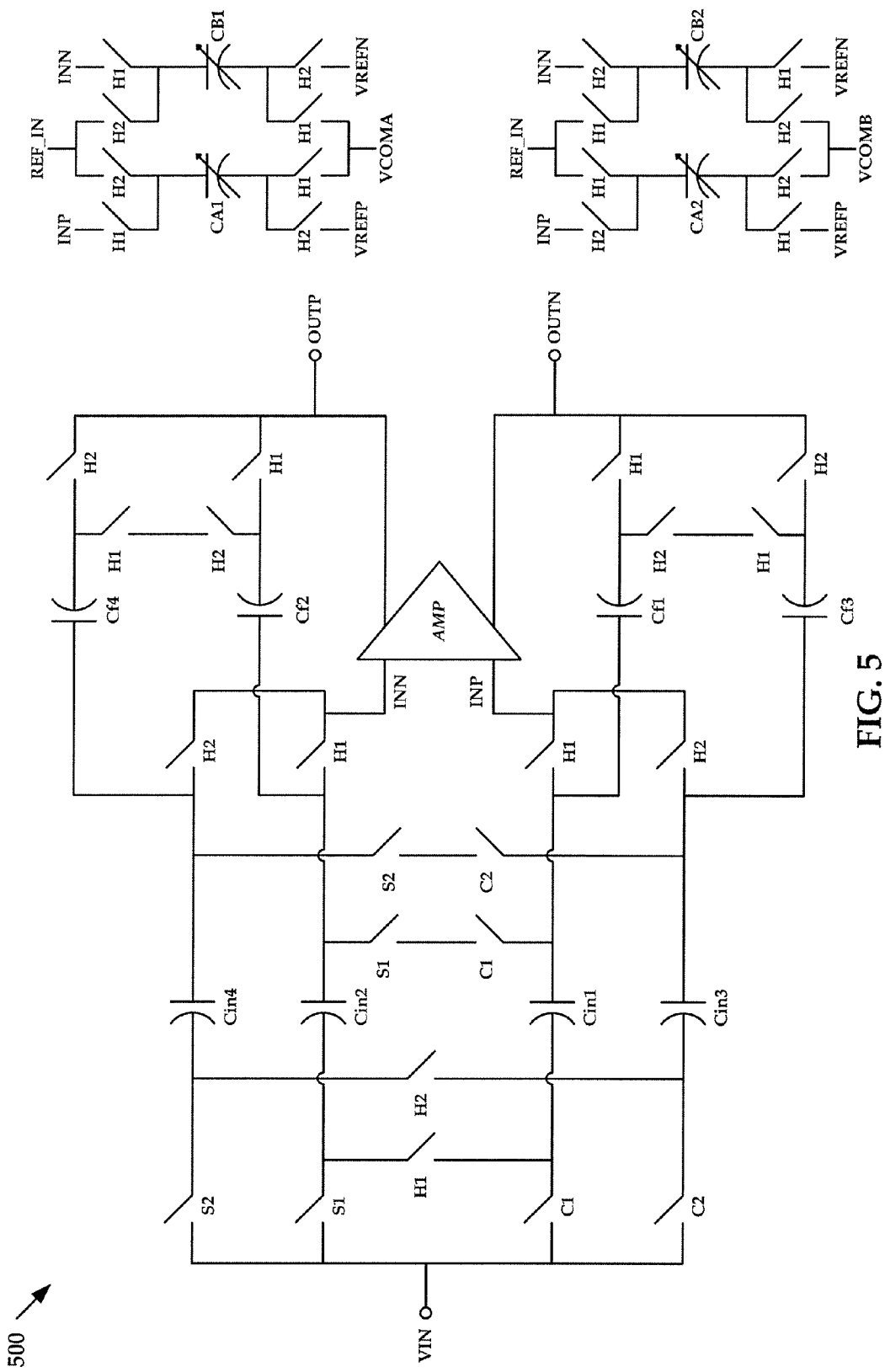
FIG. 5 is a schematic diagram of a conventional correlated double sampler circuit.

FIG. 5 is a schematic diagram of a conventional correlated double sampler (CDS) circuit (500). The illustrated CDS circuit is substantially the same as that described in U.S. Pat. No. 6,587,143, which is hereby incorporated by reference.

As illustrated by FIG. 5, two sampling capacitors (Cin2, Cin4) are used to sample the input signal level (e.g., Vsig) when switches are closed in response to signals S1 and S2, respectively; and two different sampling capacitors (Cin1, Cin3) are used to sample the input reference level or reset level (Vref) when switches are closed in response to signals C1 and C2, respectively. Signals S1 and S2 are operated in a ping-pong format so that sampling for one sampled input signal occurs during a hold phase for another sampled input signal. Signals C1 and C2 are similarly operated in a ping-pong format so that sampling for one sampled reference level occurs during a hold phase for another sampled reference level.

Also illustrated in FIG. 5, four feedback capacitors (Cf1-Cf4) are arranged in the feedback loop of the amplifier. The first feedback capacitor (Cf1) and the first sampling capacitor (Cin1) are arranged to hold previously sampled reference level from sampling capacitor Cin1, while the second feedback capacitor (Cf2) and the sampling capacitor (Cin2) holds the previously sampled input signal level, both when signal H1 is asserted. The third feedback capacitor (Cf3) and the third sampling capacitor (Cin3) are arranged to hold a different previously sampled reference level from sampling capacitor Cin3, while the fourth feedback capacitor (Cf4) and the fourth sampling capacitor (Cin4) holds the previously sampled input signal level, both when signal H2 is asserted. H1 in this instance corresponds to the hold signal for one operating phase (e.g., ping), while H2 corresponds to the hold signal for another operating phase (e.g., pong).

Four CDAC circuits (CA1, CA2, CB1 and CB2) can be adapted for use with the circuit illustrated in U.S. Pat. No. 6,587,143, which is illustrated in FIG. 5. CDAC circuit CA1 is coupled between VCOMA and INP when signal H1 is asserted. CDAC circuit CA1 is coupled between VREFP and REF_IN when signal H2 is asserted. CDAC circuit CB1 is coupled between VCOMA and INN when signal H1 is asserted. CDAC circuit CB1 is coupled between VREFN and REF_IN when signal H2 is asserted. CDAC circuit CA2 is coupled between VREFP and REF_IN when signal H1 is asserted. CDAC circuit CA2 is coupled between VCOMB and INP when signal H2 is asserted. CDAC circuit CB2 is coupled between VREFN and REF_IN when signal H1 is asserted. CDAC circuit CB2 is coupled between VCOMB and INN when signal H2 is asserted.

The output voltages for CDS circuit 500 corresponds to the difference between OUTP and OUTN, where the output associated with one phase (e.g., the "ping hold" phase) may be expressed as Vping, and the output of another phase (e.g., the "pong hold" phase) may be expressed as Vpong. In a simplest implementation, perfect matching can be assumed between capacitors under ideal conditions such that the sampling capacitors have matched capacitance values, the feedback capacitors also have matched capacitance values, and the CDACs have matched effective capacitance values. The ideal conditions can thus be expressed as:

$C_S$=sampling capacitor value=Cin1=Cin2=Cin3=Cin4
$C_F$=feedback capacitor value=Cfb1=Cfb2=Cfb3=Cfb4
$C_D$=CDAC capacitor value=CA1=CB1=CA2=CB2
$V_{CMO}$=output common mode voltage=$V_{COMA}$=$V_{COMB}$=$[V_{REFP}+V_{REFN}]/2$
$V_{CMI}$=REF_IN=input common mode voltage
$V_{REFP}$=High reference voltage
$V_{REFN}$=Low reference voltage
$V_{SIG}$=Signal level for a pixel
$V_{SREF}$=Reference level for a pixel
$V_{INN}$=Voltage at node INN
$V_{INP}$=Voltage at node INP
$V_{OUTP}$=Voltage at node OUTP
$V_{OUTN}$=Voltage at node OUTN Applying charge conservation principals at the INN terminal of the amplifier sampling and holding phases for the circuit of FIG. 5 yields the following for a ping pixel:

$$(V_{CMI}-V_{SIG}) \cdot C_S + (V_{CMI}-V_{REFP}) \cdot C_F + (V_{CMI}-V_{REFN}) \cdot C_D \quad \text{(EQ. 1A)}$$

$$(V_{INN}-V_{CMI}) \cdot C_S + (V_{INN}-V_{OUTP}) \cdot C_F + (V_{INN}-V_{CMO}) \cdot C_D \quad \text{(EQ. 1B)}$$

(EQ. 1A)=(EQ. 1B)

Applying charge conservation principals at the INP terminal of the amplifier sampling and holding phases for the circuit of FIG. 5 yields the following for a ping $$(V_{CMI}-V_{SREF}) \cdot C_S + (V_{CMI}-V_{REFN}) \cdot C_F + (V_{CMI}-V_{REFP}) \cdot C_D \quad \text{(EQ. 2A)}$$

$$(V_{INN}-V_{CMI}) \cdot C_S + (V_{INN}-V_{OUTN}) \cdot C_F + (V_{INP}-V_{CMO}) \cdot C_D \quad \text{(EQ. 2B)}$$

(EQ. 2A)=(EQ. 2B)

Subtracting EQ. 1A from EQ. 2A and EQ. 1B from EQ. 2B, yields:

$$(V_{SIG}-V_{SREF}) \cdot C_S + (V_{REFP}-V_{REFN}) \cdot C_F - (V_{REFP}-V_{REFN}) \cdot C_D \quad \text{(EQ. 3A)}$$

$$(V_{INP}-V_{INN}) \cdot C_S + (V_{INP}-V_{INN}) \cdot (C_F+C_D) + (V_{OUTP}-V_{OUTN}) \cdot C_F \quad \text{(EQ. 3B)}$$

(EQ. 3A)=(EQ. 3B)

Assuming that $V_{INP}=V_{INN}$, and consolidating terms from EQ. 3A and EQ. 3B:

$$(V_{SIG}-V_{SREF}) \cdot C_S + (V_{REFP}-V_{REFN}) \cdot (C_F-C_D) \quad \text{(EQ. 4A)}$$

$$(V_{OUTP}-V_{OUTN}) \cdot C_F \quad \text{(EQ. 4B)}$$

(EQ. 4A)=(EQ. 4B)

Rearranging EQ. 4A and 4B and solving for VDIFF= ($V_{OUTP}-V_{OUTN}$) yields:

$$V_{DIFF}=(V_{SIG}-V_{SREF}) \cdot C_S/C_F+(V_{REFP}-V_{REFN}) \cdot (1-C_D/C_F) \quad \text{(EQ. 5)}$$

Applying charge conservation principals at the INN terminal of the amplifier between sampling and holding phases for the circuit of FIG. 1A yields the following for a ping pixel:

$$(V_{CMI}-V_{SIG}) \cdot C_S+(V_{CMI}-V_{REFP}) \cdot C_F+(V_{INP}-V_{REFN}) \cdot C_D \quad \text{(EQ. 6A)}$$

$$(V_{INN}-V_{CMI}) \cdot C_S+(V_{INN}-V_{OUTP}) \cdot C_F+(V_{INN}-V_{CMO}) \cdot C_D \quad \text{(EQ. 6B)}$$

(EQ. 6A)=(EQ. 6B)

Applying charge conservation principals at the INP terminal of the amplifier between sampling and holding phases for the circuit of FIG. 1A yields the following for a ping pixel:

$$(V_{CMI}-V_{SREF}) \cdot C_S+(V_{CMI}-V_{REFN}) \cdot C_F+(V_{INN}-V_{REFP}) \cdot C_D \quad \text{(EQ. 7A)}$$

$$(V_{INP}-V_{CMI}) \cdot C_S+(V_{INP}-V_{OUTN}) \cdot C_F+(V_{INP}-V_{CMO}) \cdot C_D \quad \text{(EQ. 7B)}$$

(EQ. 7A)=(EQ. 7B)

Subtracting EQ. 6A from EQ. 7A and EQ. 6B from EQ. 7B, yields:

$$(V_{SIG}-V_{SREF}) \cdot C_S+(V_{REFP}-V_{REFN}) \cdot C_F-(V_{REFP}-V_{REFN}+V_{INP}-V_{INN}) \cdot C_D \quad \text{(EQ. 8A)}$$

$$(V_{INP}-V_{INN}) \cdot (C_S+C_F+C_D)+(V_{OUTP}-V_{OUTN}) \cdot C_F \quad \text{(EQ. 8B)}$$

(EQ. 8A)=(EQ. 8B)

Assuming that $V_{INP}=V_{INN}$, and consolidating terms from EQ. 8A and EQ. 8B:

$$(V_{SIG}-V_{SREF}) \cdot C_S+(V_{REFP}-V_{REFN}) \cdot (C_F-C_D) \quad \text{(EQ. 9A)}$$

$$(V_{OUTP}-V_{OUTN}) \cdot C_F \quad \text{(EQ. 9B)}$$

(EQ. 9A)=(EQ. 9B)

Rearranging EQ. 9A and 9B and solving for VDIFF= ($V_{OUTP}-V_{OUTN}$) yields:

$$V_{DIFF}=(V_{SIG}-V_{SREF}) \cdot C_S/C_F+(V_{REFP}-V_{REFN}) \cdot (1-C_D/C_F) \quad \text{(EQ. 10)}$$

As illustrated above, EQ. 5 is equal to EQ. 10, which indicates that the operation of the CDS circuit described with respect to FIG. 1A yields the same output signals as that described with respect to FIG. 5, with two fewer CDAC circuits.

The above specification, examples and data provide a complete description of the manufacture and use of the composition of the invention. Since many embodiments of the invention can be made without departing from the spirit and scope of the invention, the invention resides in the claims hereinafter appended.

We claim:

1. An apparatus for processing an analog input signal, wherein the apparatus is configured according to a correlated double sampling (CDS) ping-pong architecture, the apparatus comprising:

an amplifier circuit that is dynamically configured in either a first hold configuration or a second hold configuration, wherein the amplifier circuit includes a differential input terminal comprising a first input terminal and a second input terminal, and a differential output terminal comprising a first output terminal and a second output terminal, wherein the amplifier circuit configured in a first hold configuration during a first time interval, and wherein the amplifier circuit is configured in a second hold configuration during a second time interval, wherein a differential output signal is observed at the differential output terminal that is dependent upon prior samples from the analog input signal;

a first capacitive digital-to-analog converter circuit that is coupled between a third reference voltage and the second input terminal during the first hold configuration, wherein the first capacitive digital-to-analog converter circuit is coupled between a first reference voltage and the first input terminal during the second hold configuration;

a second capacitive digital-to-analog converter circuit that is coupled between the third reference voltage and the first input terminal during the first hold configuration, wherein the second capacitive digital-to-analog converter circuit is coupled between a second reference voltage and the second input terminal during the second hold configuration;

a first reference sampling capacitor circuit that is configured for sampling the analog input signal during the first time interval to provide a first sampled reference level when the analog input signal corresponds to a first reference level, wherein the first reference sampling capacitor circuit is coupled between a first intermediate node and the first input terminal when the amplifier circuit is arranged in the second hold configuration;

a first input sampling capacitor circuit that is configured for sampling the analog input signal during the first time interval to provide a first sampled signal level when the analog input signal corresponds to a first signal level, wherein the first input sampling capacitor circuit is coupled between the first intermediate node and the second input terminal when the amplifier circuit is arranged in the second hold configuration;

a second reference sampling capacitor circuit that is configured for sampling the analog input signal during the second time interval to provide a second sampled reference level when the analog input signal corresponds to a second reference level, wherein the second reference sampling capacitor circuit is coupled between a second intermediate node and the first input terminal when the amplifier circuit is arranged in the first hold configuration;

a second input sampling capacitor circuit that is configured for sampling the analog input signal during the second time interval to provide a second sampled signal level when the analog input signal corresponds to a second signal level, wherein the second input sampling capacitor circuit is coupled between the second intermediate node and the second input terminal when the amplifier circuit is arranged in the first hold configuration;

a first feedback capacitor circuit that is configured in a first initialization configuration with the first reference voltage during the first time interval, wherein the first feedback capacitor circuit is coupled between the first input terminal and the first output terminal when the amplifier circuit is arranged in the second hold configuration;

a second feedback capacitor circuit that is configured in a second initialization configuration with the second reference voltage during the first time interval, wherein the second feedback capacitor circuit is coupled between the second input terminal and the second output terminal when the amplifier circuit is arranged in the second hold configuration;

a third feedback capacitor circuit that is configured in the first initialization configuration with the first reference voltage during the second time interval, wherein the third feedback capacitor circuit is coupled between the first input terminal and the first output terminal when the amplifier circuit is arranged in the first hold configuration; and a fourth feedback capacitor circuit that is configured in the second initialization configuration with the second reference voltage during the second time interval, wherein the second feedback capacitor circuit is coupled between the second input terminal and the second output terminal when the amplifier circuit is arranged in the first hold configuration.

2. The apparatus of claim 1, wherein each of the first input sampling capacitor circuit, the second input sampling capacitor circuit, the first reference sampling capacitor circuit, and the second reference sampling capacitor circuit have an effective capacitance value that is matched to one another.

3. The apparatus of claim 1, wherein each of the first feedback capacitor circuit, the second feedback capacitor circuit, the third feedback capacitor circuit, and the fourth feedback capacitor circuit have an effective capacitance value that is matched to one another.

4. The apparatus of claim 1, wherein each of the first input sampling capacitor circuit, the second input sampling capacitor circuit, the first reference sampling capacitor circuit, the second reference sampling capacitor circuit, the first feedback capacitor circuit, the second feedback capacitor circuit, the third feedback capacitor circuit, and the fourth feedback capacitor circuit have an effective capacitance value that is matched to one another.

5. The apparatus of claim 1, wherein the first capacitive digital-to-analog converter circuit and the second capacitive digital-to-analog converter circuit each have a selectively controlled effective capacitance value that is matched to one another during operation.

6. The apparatus of claim 1, wherein the first capacitive digital-to-analog converter circuit comprises a first switch circuit and a second switch circuit that are selectively activated for the second hold configuration of the amplifier circuit, a third switch circuit and a fourth switch circuit that are selectively activated for the first hold configuration of the amplifier circuit, and a first adjustable capacitance circuit, wherein first switch circuit is arranged to couple a first terminal of the first adjustable capacitance circuit to the first input of the amplifier circuit, the second switch circuit is arranged to couple a second terminal of the first adjustable capacitance circuit to the first reference voltage, the third switch circuit is arranged to couple the first terminal of the first adjustable capacitance circuit to the second input of the amplifier circuit, and the fourth switch circuit is arranged to couple the second terminal of the first adjustable capacitance circuit to the third reference voltage.

7. The apparatus of claim 6, wherein the second capacitive digital-to-analog converter circuit comprises a fifth switch circuit and a sixth switch circuit that are selectively activated for the first hold configuration of the amplifier circuit, a seventh switch circuit and an eighth switch circuit that are selectively activated for the second hold configuration of the amplifier circuit, and a second adjustable capacitance circuit, wherein fifth switch circuit is arranged to couple a first terminal of the second adjustable capacitance circuit to the first input of the amplifier circuit, the sixth switch circuit is arranged to couple a second terminal of the adjustable capacitance circuit to the third reference voltage, the seventh switch circuit is arranged to couple the first terminal of the adjustable capacitance circuit to the second input of the amplifier circuit, and the eighth switch circuit is arranged to couple the second terminal of the adjustable capacitance circuit to the second reference voltage.

8. The apparatus of claim 1, further comprising a control circuit that is arranged to provide control signals to selectively control the operation for each of the first input sampling capacitor circuit, the first reference sampling capacitor circuit, the second input sampling capacitor circuit, the second reference sampling capacitor circuit, the first feedback capacitor circuit, the second feedback capacitor circuit, the third feedback capacitor circuit and the fourth feedback capacitor circuit.

9. The apparatus of claim 5, wherein the control circuit is further arranged to provide control signals to selectively control the operation for each of the first capacitive digital-to-analog converter circuit and the second capacitive digital-to-analog converter circuit.

10. The apparatus of claim 1, wherein the first reference voltage corresponds to a high reference voltage, the second reference voltage corresponds to a low reference voltage, and the third reference voltage corresponds to an output common mode voltage.

11. The apparatus of claim 1, wherein the third reference voltage has a value that is midway between the first reference voltage and the second reference voltage.

12. A method for processing an analog input signal with an apparatus that is configured in a correlated double sampling (CDS) ping-pong architecture, the method comprising:

sampling the analog input signal at a first time during a first time interval with a first reference sampling capacitor circuit to provide a first sampled reference level when the analog input signal corresponds to a first reference level;

sampling the analog input signal at a second time that is subsequent to the first time during the first time interval with a first input sampling capacitor circuit to provide a first sampled signal level when the analog input signal corresponds to a first signal level;

sampling the analog input signal at a first time during a second time interval with a second reference sampling capacitor circuit to provide a second sampled reference level when the analog input signal corresponds to a second reference level;

sampling the analog input signal at a second time that is subsequent to the third time during the second time interval with a second reference sampling capacitor circuit to provide a second sampled signal level when the analog input signal corresponds to a second signal level;

initializing a first feedback capacitor circuit with a first reference voltage during the first time interval;

coupling a second feedback capacitor circuit between a first input and a first output of a differential amplifier circuit during the first time interval;

initializing a third feedback capacitor circuit with a second reference voltage during the first time interval;

coupling a fourth feedback capacitor circuit between a second input and a second output of the differential amplifier circuit during the first time interval;

coupling a first capacitive digital-to-analog converter between a third reference voltage and the first input of the differential amplifier circuit during the first time interval;

coupling a second capacitive digital-to-analog converter between the third reference voltage and the second input of the differential amplifier circuit during the first time interval;

coupling the first feedback capacitor circuit between the first input and the first output of the differential amplifier circuit during a second time interval;
initializing the second feedback capacitor circuit with the first reference voltage during the second time interval;
coupling the third feedback capacitor circuit between the second input and the second output of the differential amplifier circuit during the second time interval;
initializing the fourth feedback capacitor circuit with the second reference voltage during the second time interval;
coupling the first capacitive digital-to-analog converter between the first reference voltage and the first input of the differential amplifier circuit during the second time interval;
coupling the second capacitive digital-to-analog converter between the second reference voltage and the second input of the differential amplifier circuit during the first time interval; and
generating a differential output signal with the differential amplifier circuit during each of the first and second time intervals based prior samples of the analog input signal.

13. The method of claim 12, further comprising adjusting the gain of the differential output signal with a programmable gain amplifier (PGA) circuit that is arranged to provide an adjusted gain differential output signal in response thereto.

14. The method of claim 12, further comprising converting the adjusted gain differential output signal to a digital output signal with an analog-to-digital converter (ADC) circuit.

15. The method of claim 14 further comprising, subtracting correction values from the digital output signal with a digital processing circuit to provide processed digital image data.

16. The method of claim 14 further comprising, subtracting correction values from the digital output signal with a digital processing circuit.

17. An apparatus for processing an analog input signal, wherein the apparatus is configured in a correlated double sampling (CDS) ping-pong architecture, the apparatus comprising:
a differential amplifier circuit that includes a first amplifier input terminal, a second amplifier input terminal, a first amplifier output terminal, and a second amplifier output terminal, wherein the differential amplifier circuit is arranged for operation in either a ping hold mode or a pong hold mode, wherein the ping hold mode is operated during a ping time interval, and wherein the pong hold mode is operated during a pong time interval;
a first capacitive digital-to-analog converter circuit that is selectively coupled between a first reference signal and the first amplifier input terminal during the pong hold interval, wherein the first capacitive digital-to-analog converter circuit is also selectively coupled between a third reference signal and the second amplifier input terminal during the ping hold interval;
a second capacitive digital-to-analog converter circuit that is selectively coupled between a second reference signal and the second amplifier input terminal during the pong hold interval, wherein the second capacitive digital-to-analog converter circuit is also selectively coupled between the third reference signal and the first amplifier input terminal during the ping hold interval;
a first capacitor circuit that is selectively is selectively coupled between a first intermediate node and the first amplifier input terminal during the ping hold interval, wherein the first capacitor circuit is also selectively coupled between the analog input signal and a ground reference signal during a ping sample signal interval that occurs within the pong hold interval;
a second capacitor circuit that is selectively coupled between a second intermediate node and the first amplifier input terminal during the pong hold interval, wherein the second capacitor circuit is also selectively coupled between the analog input signal and the ground reference signal during a pong sample signal interval that occurs within the ping hold interval;
a third capacitor circuit that is selectively is selectively coupled between the first intermediate node and the second amplifier input terminal during the ping hold interval, wherein the third capacitor circuit is also selectively coupled between the analog input signal and the ground reference signal during a ping sample reference interval that occurs within the pong hold interval;
a fourth capacitor circuit that is selectively coupled between the second intermediate node and the second amplifier input terminal during the pong hold interval, wherein the second capacitor circuit is also selectively coupled between the analog input signal and the ground reference signal during the pong sample reference interval that occurs within the ping hold interval;
a fifth capacitor circuit that is selectively coupled between a first reference signal and the ground reference signal during the pong hold interval, wherein the fifth capacitor circuit is also selectively coupled between the first amplifier input terminal and the first amplifier output terminal during the ping hold interval;
a sixth capacitor circuit that is selectively coupled between the first reference signal and the ground reference signal during the ping hold interval, wherein the fifth capacitor circuit is also selectively coupled between the first amplifier input terminal and the first amplifier output terminal during the pong hold interval;
a seventh capacitor circuit that is selectively coupled between a second reference signal and the ground reference signal during the pong hold interval, wherein the seventh capacitor circuit is also selectively coupled between the second amplifier input terminal and the second amplifier output terminal during the ping hold interval; and
an eighth capacitor circuit that is selectively coupled between the second reference signal and the ground reference signal during the ping hold interval, wherein the seventh capacitor circuit is also selectively coupled between the second amplifier input terminal and the second amplifier output terminal during the pong hold interval.

18. The apparatus of claim 17, wherein ground reference signal corresponds to one of: an input common-mode voltage, a mid-supply voltage, a ground voltage, and a regulated voltage.

19. The apparatus of claim 17, wherein the first reference voltage corresponds to a high reference voltage, the second reference voltage corresponds to a low reference voltage, and the third reference voltage corresponds to an output common mode voltage.

20. The apparatus of claim 1, wherein the third reference voltage has a value that is midway between the first reference voltage and the second reference voltage.

* * * * *

UNITED STATES PATENT AND TRADEMARK OFFICE
CERTIFICATE OF CORRECTION

PATENT NO. : 7,453,389 B1 Page 1 of 1
APPLICATION NO. : 11/846470
DATED : November 18, 2008
INVENTOR(S) : Ha Chu Vu et al.

It is certified that error appears in the above-identified patent and that said Letters Patent is hereby corrected as shown below:

Column 2, Line 65: "and N11, and" should read --and N10, and--

Column 3, Line 28: "N8 and N11," should read --N8 and N10--

Column 5, Line 13: "circuit 10" should read --circuit 110--

Column 5, Line 20: "circuit 10" should read --circuit 110--

Column 8, Line 41: "a "pong pixel" (e.g., VSREF = VI = Vref2)," should read --a "pong pixel" (e.g., VSREF = VIN = Vref2),--

Column 12, Line 32: "the amplifier sampling" should read --the amplifier between sampling--

Column 12, Line 42: "amplifier sampling and holding" should read --amplifier between sampling and holding--

Column 12, Line 43: "for a ping" should read --for a ping pixel:--

Column 12, Line 47: "$(V_{INN}-V_{CMI}) \cdot C_S+(V_{INN}-V_{OUTN}) \cdot C_F+(V_{INP}-V_{CMO}) \cdot C_D$" should read --$(V_{INP}-V_{CMI}) \cdot C_S+(V_{INP}-V_{OUTN}) \cdot C_F+(V_{INP}-V_{CMO}) \cdot C_D$--

Column 18, Line 12: "that is selectively is selectively" should read --that is selectively--

Signed and Sealed this

Seventeenth Day of March, 2009

JOHN DOLL
*Acting Director of the United States Patent and Trademark Office*